(12) United States Patent
Suzuki et al.

(10) Patent No.: US 7,619,219 B2
(45) Date of Patent: Nov. 17, 2009

(54) SCANNING ELECTRON MICROSCOPE

(75) Inventors: Naomasa Suzuki, Hitachinaka (JP);
Hiroyuki Ito, Hitachinaka (JP); Ichiro Tachibana, Hitachinaka (JP)

(73) Assignee: Hitachi High - Technologies Corporation, Tokyo (JP)

( * ) Notice: Subject to any disclaimer, the term of this patent is extended or adjusted under 35 U.S.C. 154(b) by 150 days.

(21) Appl. No.: 11/953,496

(22) Filed: Dec. 10, 2007

(65) Prior Publication Data

US 2008/0135755 A1  Jun. 12, 2008

(30) Foreign Application Priority Data

Dec. 11, 2006  (JP)  ............................. 2006-323747

(51) Int. Cl.
*H01J 37/28* (2006.01)
*H01J 37/256* (2006.01)
(52) U.S. Cl. .................. 250/310; 250/306; 250/396 R; 250/396 ML; 250/397
(58) Field of Classification Search .................. 250/310, 250/306, 396 R, 396 ML, 397
See application file for complete search history.

(56) References Cited

U.S. PATENT DOCUMENTS

| 5,872,358 | A | * | 2/1999 | Todokoro et al. | ............ | 250/310 |
|---|---|---|---|---|---|---|
| 5,900,629 | A | | 5/1999 | Todokoro et al. | | |
| 6,069,356 | A | | 5/2000 | Todokoro et al. | | |
| 6,084,238 | A | * | 7/2000 | Todokoro et al. | ............ | 250/310 |
| 7,504,626 | B2 | * | 3/2009 | Tachibana et al. | ............ | 250/310 |
| 2007/0187598 | A1 | | 8/2007 | Tachibana et al. | | |
| 2008/0310704 | A1 | * | 12/2008 | Tachibana et al. | ............ | 382/148 |

FOREIGN PATENT DOCUMENTS

| JP | 9-171791 A | 6/1997 |
|---|---|---|
| JP | 2007-220399 A | 8/2007 |

* cited by examiner

*Primary Examiner*—Nikita Wells
(74) *Attorney, Agent, or Firm*—Crowell & Moring LLP

(57) ABSTRACT

The present invention was made in view of a problem of an electron microscope in which a reduction in detection efficiency of electrons detected by a detector should be prevented by eliminating any influence of a leakage magnetic field through a gap in an objective lens onto the electrons emitted from a specimen. To solve the problem, the present invention provides an electron microscope having a configuration with: a pole piece electrode for accelerating primary electrons emitted at an electrons source; and an objective lens including the pole piece electrode. In the objective lens, an electrically and magnetically insulated gap is formed between the pole piece electrode and other pole piece, and an auxiliary coil is concentrically disposed with the objective lens at a middle position between the gap and a detection surface of the electron detector, with an electric current flowing through the auxiliary coil in the opposite direction from that of an electric current flowing through the objective lens coil.

6 Claims, 4 Drawing Sheets

SCANNING ELECTRON MICROSCOPE

BACKGROUND OF THE INVENTION

1. Field of the Invention

The present invention relates to a scanning electron microscope, particularly to a scanning electron microscope in which a reduction in detection efficiency of electron emitted from a specimen is prevented.

2. Background Art

A scanning electron microscope is a device for forming an image of a scanned specimen, by focusing a primary electrons beam emitted from an electrons source using a condenser lens and an objective lens, scanning the electrons beam over a specimen and irradiating the specimen to cause secondary electron emission from the specimen, detecting the emitted secondary electrons, and synchronizing a detection signal of the secondary electrons with a scanning of the electrons beam for an imaging process.

In such a scanning electron microscope, a detection efficiency of secondary electrons is an important factor for increasing an S/N (signal-to-noise ratio) of a specimen image. An increased detection efficiency of secondary electrons requires an increased amount of electrons emitted from the specimen and detected by the scanning electron microscope. The electrons emitted from a specimen have various types of energies. Generally, the electrons having energy up to 50 eV is called secondary electron, while the electrons having energy above 50 eV is called backscattered electron. A detector is applied a positive pull-in voltage on the order of 10 kV for pulling in electrons (especially, low-energy secondary electrons) emitted from a specimen.

Meanwhile, a scanning electron microscope is used for example by accelerating primary electrons through a magnetic field of an objective lens, as an approach for enhancing a resolving power for imaging a specimen. In order to accelerate the primary electrons, an electrode is provided to an objective lens, or a pole piece of an objective lens is electrically insulated and a positive voltage is applied thereto. In the latter case, a misalignment between a magnetic field produced by the objective lens and an electric field generated by the application of the voltage can be decreased, resulting in enhancement of a resolving power (see JP Patent Publication (Kokai) No. 9-171791A (1997), for example).

However, in this case, the electrically insulated gap is also magnetically insulated, which leads to a leakage of the magnetic field across the gap. If such a leaked magnetic field exists between a specimen and a detector, the leaked magnetic field causes an electron trajectory to the detector of electrons emitted from the specimen toward the detector to be curved, and a less amount of the electrons reach the detector. This results in a problem of a reduced S/N ratio of the specimen image.

SUMMARY OF THE INVENTION

One object of the present invention is to provide a scanning electron microscope in which an electron detection efficiency obtained by using a detector is not reduced by eliminating any influence of a leakage magnetic field across a gap in an objective lens onto the electrons emitted from a specimen.

According to an embodiment of the present invention, a scanning electron microscope is configured to include: a pole piece electrode for accelerating primary electrons emitted from an electrons source; an objective lens including the pole piece electrode, an electrically and magnetically insulated gap being formed therein between the pole piece electrode and other pole piece; an electron detector; and an auxiliary coil which is concentrically disposed with the objective lens at a middle position between the gap and a detection surface of the electron detector, with an electric current flowing through the auxiliary coil in the opposite direction from that of an electric current flowing through the objective lens coil.

According to the present invention, any influence of a leakage magnetic field across a gap in an objective lens onto the electrons emitted from a specimen is eliminated; thereby a reduction in electron detection efficiency obtained by using a detector can be prevented.

DETAILED DESCRIPTION OF THE PREFERRED EMBODIMENTS

Now, embodiments of the present invention will be explained below with reference to the drawings.

First Embodiment

Figure 1:
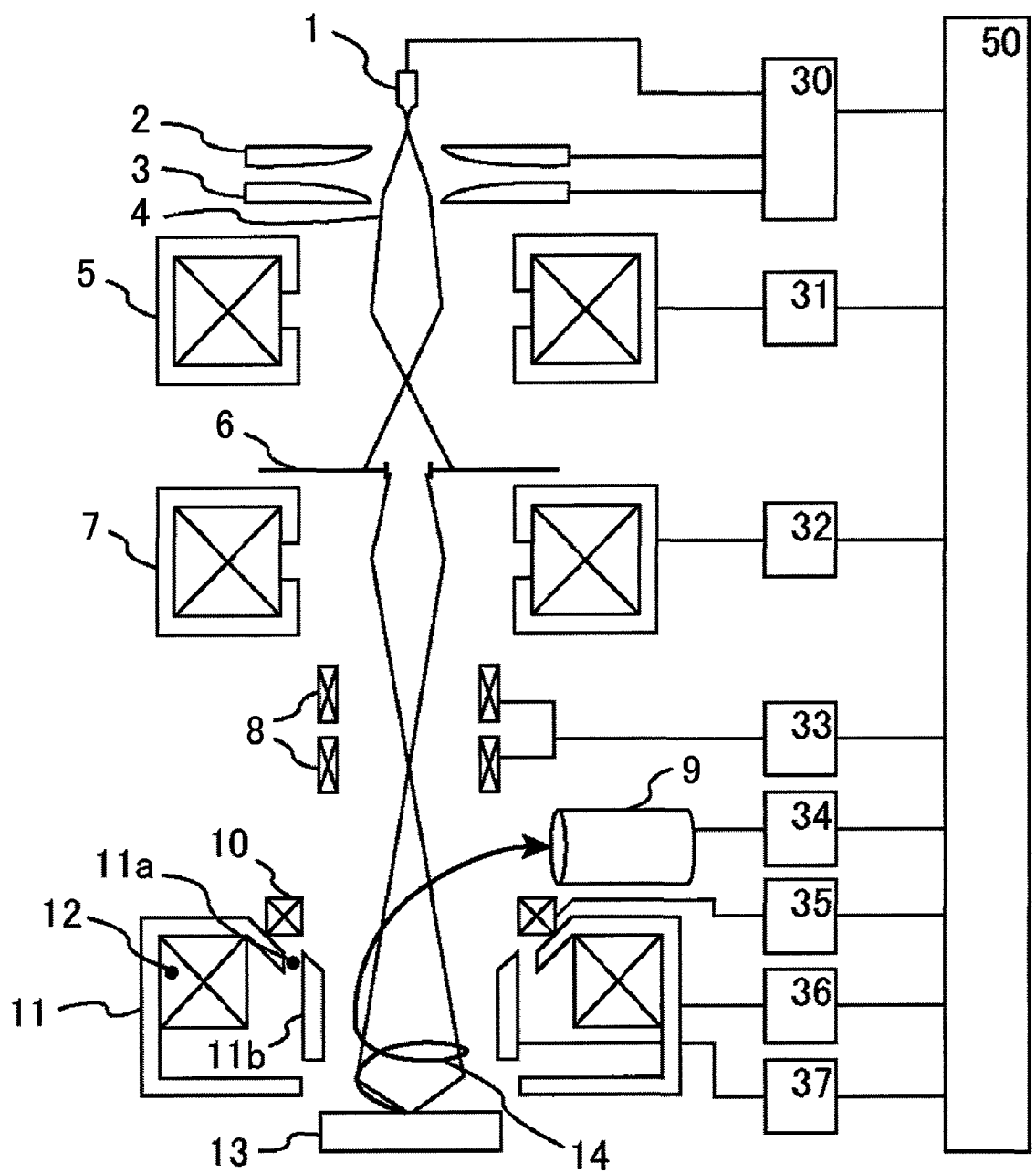
FIG. 1 is a schematic longitudinal sectional view of a configuration of a scanning electron microscope.

FIG. 1 is a schematic longitudinal sectional view of a first embodiment of the present invention, showing a configuration of a scanning electron microscope with a vacuum column being not shown therein. Each component of the scanning electron microscope is controlled by a microprocessor 50. A pull-in voltage is applied between a cathode 1 that is an electrons source and a first anode 2 by a high voltage control power source 30 which is controlled by the microprocessor 50, so that primary electrons 4 of a predetermined emission electric current are pulled out of the cathode 1. Between the cathode 1 and a second anode 3, an accelerating voltage is applied by the high voltage control power source 30 controlled by the microprocessor 50, which accelerates the primary electrons 4 emitted from the cathode 1 to advance to a downstream lens system.

The primary electrons 4 are focused by a first condenser lens 5 controlled by a first condenser lens control power source 31, and are limited by a throttle plate 6 to exclude unnecessary portion thereof. Then, the primary electrons 4 are further focused onto a specimen 13 by a second condenser lens 7 which is controlled by a second condenser lens control power source 32 and an objective lens 11 having an objective lens coil 12 which is controlled by an objective lens control power source 36. The specimen 13 is two dimensionally scanned by the primary electrons 4, by controlling a scanning signal depending on an observation magnification at the microprocessor 50 by a scanning beam reflector control power source 33, and supplying the signal to a scanning beam deflector 8.

The objective lens 11 is provided with a pole piece electrode 11b via an electrically and magnetically insulated gap 11a. The pole piece electrode 11b is applied with a positive voltage which is controlled by an accelerating electrode control power source 37, so that the primary electrons 4 flowing through the objective lens 11 are accelerated. An auxiliary coil 10 is arranged adjacent to the gap 11a between the objective lens 11 and the second condenser lens 7. The electric current flowing through the auxiliary coil 10 is controlled by an auxiliary coil control power source 35.

Secondary electrons 14 are emitted from the specimen 13 upon the irradiation of the primary electrons 4, and are pulled into a detector 9 by a positive voltage applied to the detector 9, and detected there. The detection signal is synchronized with the scanning beam of the primary electrons 4 produced by the scanning beam deflector control power source 33 and processed by the microprocessor 50 to be displayed as a specimen image on an image displaying device 34.

Figure 2:
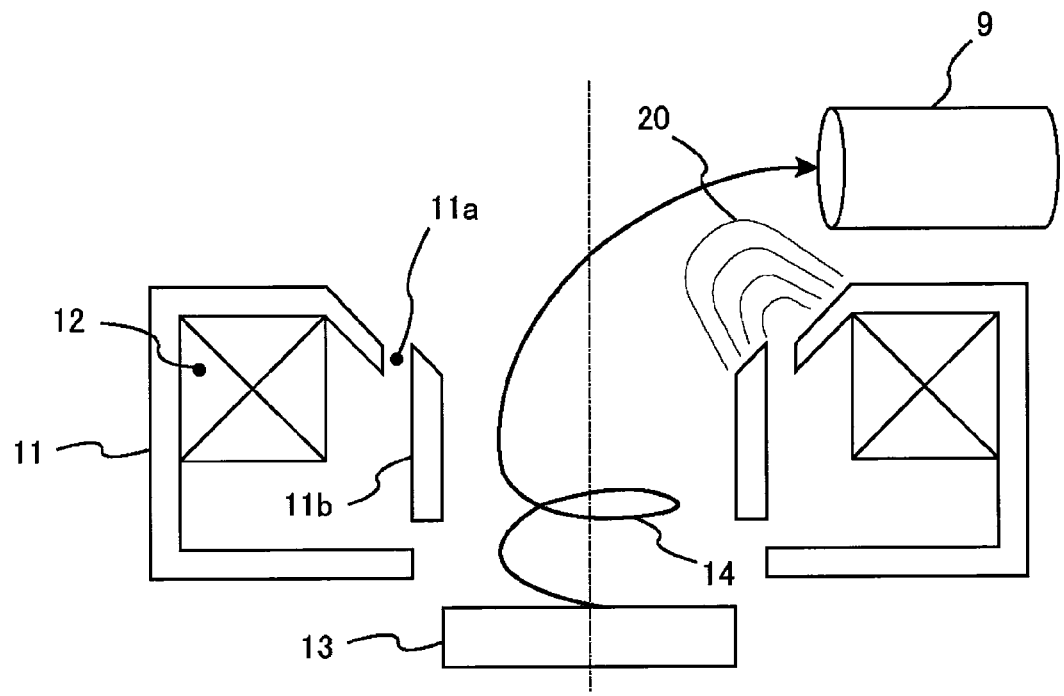
FIG. 2 is an enlarged sectional view showing a part around an objective lens 11 of FIG. 1.
Figure 3:
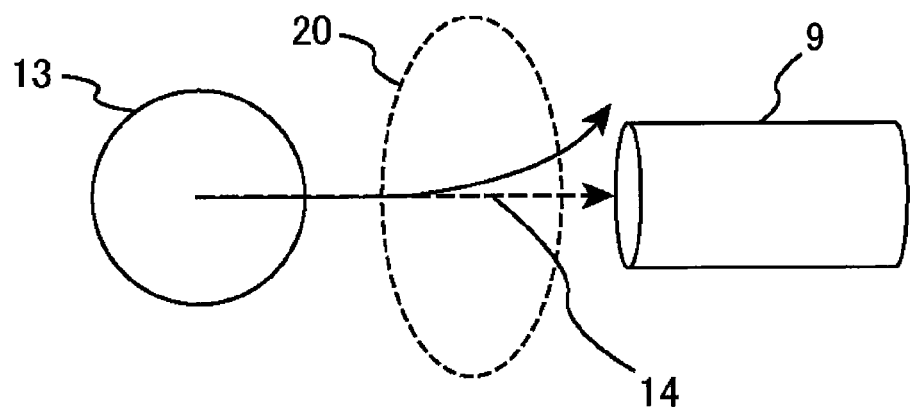
FIG. 3 is a top plan view showing the part of FIG. 2 seen from the top of a second condenser lens 7 side.

FIG. 2 is an enlarged sectional view showing a part around the objective lens 11 of FIG. 1, but unlike FIG. 1, the auxiliary coil 10 is not provided to the part to illustrate an example of the prior art of the present invention. FIG. 3 is a top plan view showing the part of FIG. 2 seen from the top of the second condenser lens 7 side. The gap 11a in the objective lens 11 causes a leakage of a magnetic field of the objective lens 11 across the gap 11a. A magnetic flux line of the leakage magnetic field 20 is diagrammatically shown in FIG. 2. A trajectory of the secondary electrons 14 from the specimen 13 overlaps the position of the leakage magnetic field 20, resulting in that, as shown in FIG. 3, although the trajectory of the secondary electrons 14 should originally run along the broken line, the trajectory is curved as shown by the continuous line and the secondary electrons 14 miss the detector 9, which results in a reduction in a detection efficiency.

Figure 4:
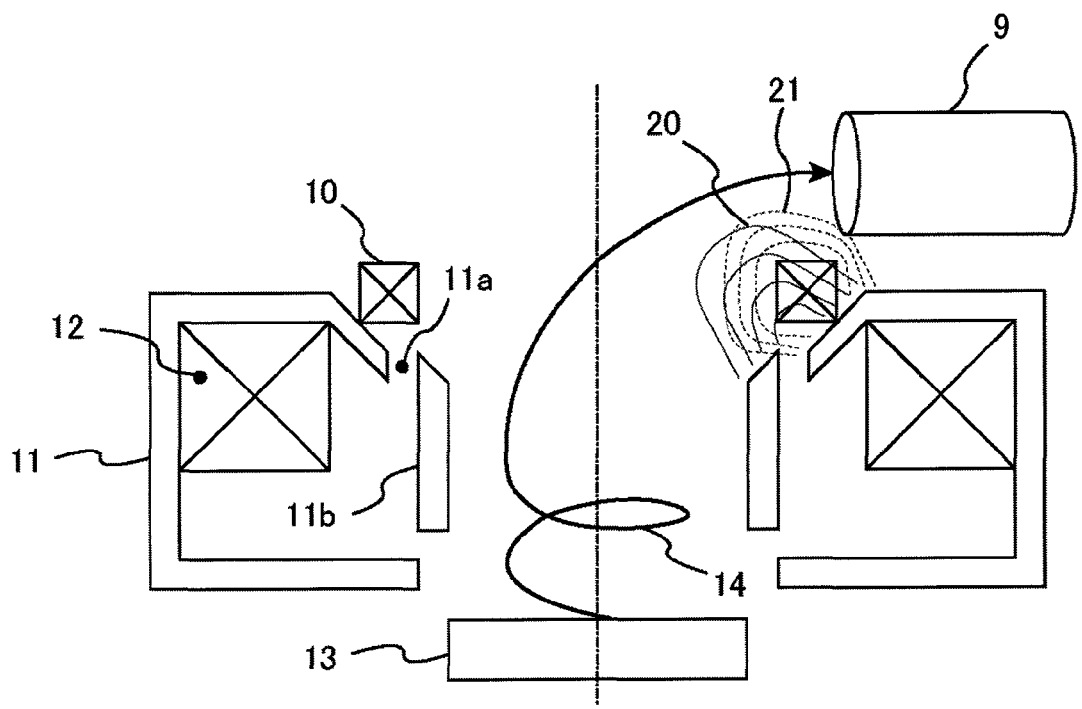
FIG. 4 is an enlarged sectional view showing a part around the objective lens 11 of FIG. 1.
Figure 5:
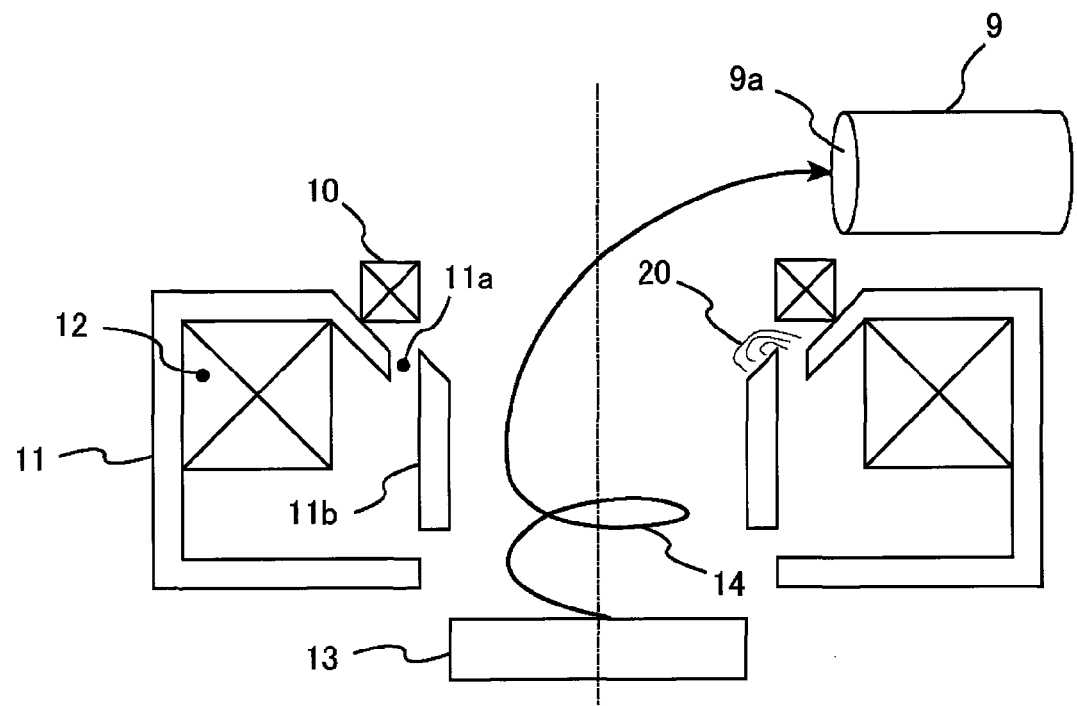
FIG. 5 is an enlarged sectional view showing a part around the objective lens 11 of FIG. 1.

FIG. 4 and FIG. 5 are enlarged sectional views showing the part around the objective lens 11 of FIG. 1 similar to FIG. 2, but the part is provided with the auxiliary coil 10 of the present invention. The magnetic flux line of the leakage magnetic field 20 is shown by the continuous lines, and the magnetic flux line of the magnetic field produced by the auxiliary coil 10 is shown by the broken lines.

When the gap 11a of the objective lens 11 is positioned on the upper side, that is, on the second condenser lens 7 side, the leakage magnetic field 20 is produced upward, and considerably influences the trajectory of the secondary electrons 14 to the detector 9. Therefore, the auxiliary coil 10 is disposed at a middle position between the gap 11a and a detection surface 9a of the detector 9, so that the influence of the leakage magnetic field 20 can be reduced. When an electric current flows through the auxiliary coil 10 in the opposite direction from that of an electric current flowing through the objective lens coil 12, the auxiliary coil 10 produces a magnetic field 21. The magnetic field 21 and the leakage magnetic field 20 produced by the objective lens 11 negate each other, thereby the leakage magnetic field 20 can be decreased as shown in FIG. 5. In this way, the influence of the leakage magnetic field 20 onto the trajectory of the secondary electrons 14 can be eliminated, which leads to a prevention of reduction in a detection efficiency of the secondary electrons 14 by the detector 9.

The intensity of the leakage magnetic field 20 generated across the gap 11a of the objective lens 11 is increased in proportion to the electric current flowing through the coil 12 of the objective lens 11. Thus, in order to negate the leakage magnetic field 20, the electric current flowing through the auxiliary coil 10 is also controlled in proportion to the electric current flowing through the coil 12.

Figure 6:
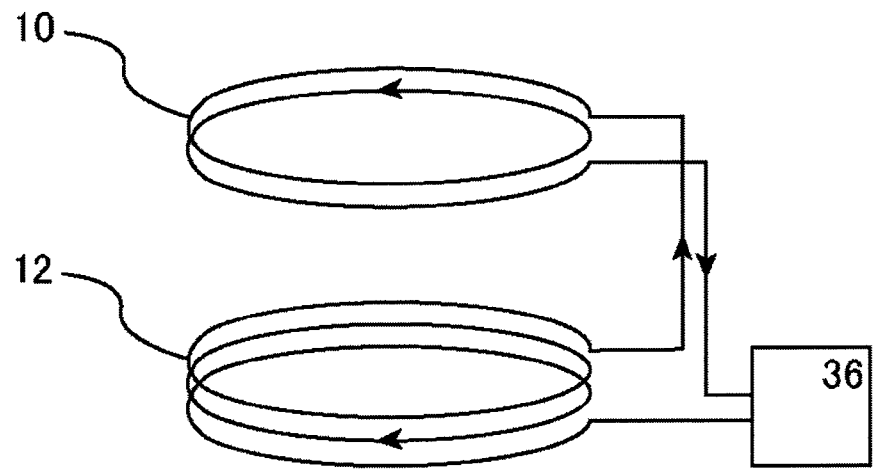
FIG. 6 is a schematic diagram showing a control of electric currents flowing through an objective lens coil 12 and an auxiliary coil 10 by means of an objective lens control power source 36.

FIG. 6 is a schematic diagram showing a control of electric currents flowing through an objective lens coil 12 and an auxiliary coil 10 by means of an objective lens control power source 36. The number of windings of the auxiliary coil 10 is determined in advance so that the auxiliary coil 10 produces the magnetic field 21 which is required to negate the leakage magnetic field 20 produced by the objective lens 11 when the electric current similar to that flowing through the objective lens coil 12 flows through the auxiliary coil 10. And then, as shown in FIG. 6, after the objective lens coil 12 and the auxiliary coil 10 are connected in series, the electric currents are caused to flow in opposite directions therethrough. This configuration enables a control of the objective lens coil 12 and the auxiliary coil 10 only by the objective lens control power source 36, which eliminates the auxiliary coil control power source 35.

Second Embodiment

Figure 7:
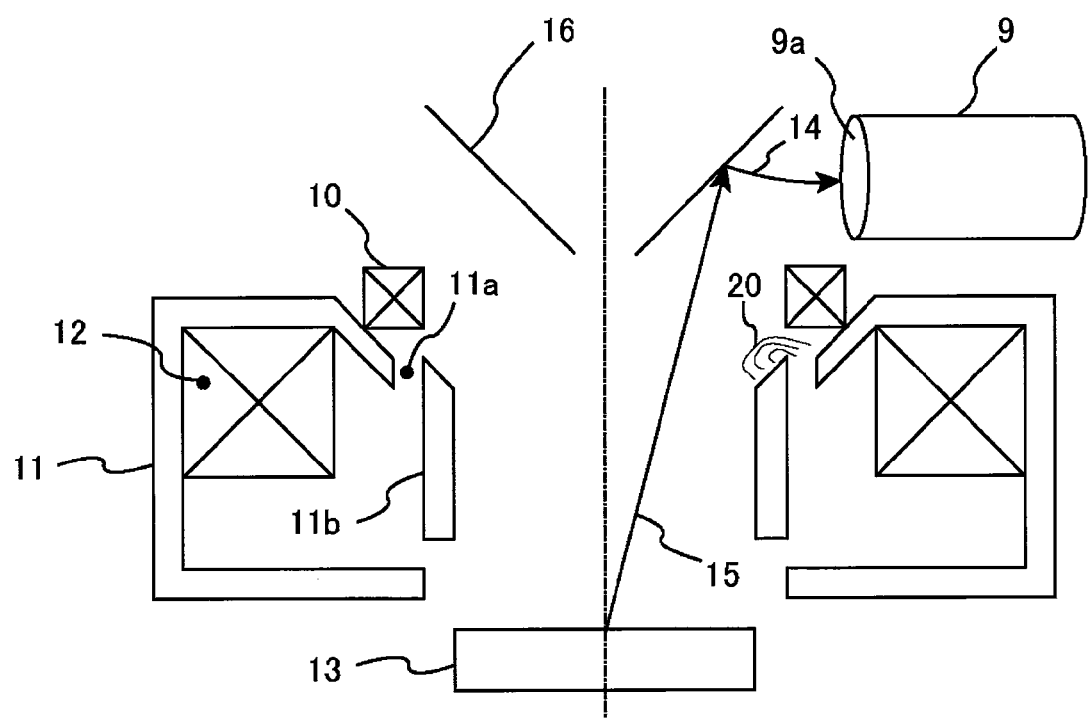
FIG. 7 is an enlarged sectional view showing a part around the objective lens 11 of FIG.

FIG. 7 shows a second embodiment of the present invention, and is an enlarged sectional view showing a part around the objective lens 11 of FIG. 1 to which a reflector 16 is further provided.

The auxiliary coil 10 is still effective in the configuration of the present embodiment in which backscattered electrons 15 emitted from a specimen 13 collide with the reflector 16 so that secondary electrons 14 are emitted therefrom to be detected by the detector 9, to prevent the influence of the leakage magnetic field 20 from the objective lens 11. An alternative configuration in which, instead of the backscattered electrons 15, secondary electrons collide with the reflector 16 also provides the same effect.

When the gap 11a of the objective lens 11 is positioned on the upper side, that is, on the second condenser lens 7 side, the leakage magnetic field 20 is produced upward, and so influences the trajectory of the secondary electrons 14 to the detector 9 after the collision of the backscattered electrons 15 with the reflector 16 more than the trajectory of the backscattered electrons 15. Therefore, the auxiliary coil 10 is disposed at a middle position between the gap 11a and a detection surface 9a of the detector 9, so that the influence of the leakage magnetic field 20 can be reduced.

As described above, when a magnetic gap is formed in an objective lens, any influence of a leakage magnetic field through the gap onto an electron trajectory from a specimen should be eliminated to prevent reduction in electron detection efficiency. According to the embodiments of the present invention, an auxiliary coil can be disposed at a middle position between the gap and an electrons beam detection surface of the detector to produce a magnetic field that generates a magnetic flux in the opposite direction from that of a magnetic flux of a leakage magnetic field, so that the influence of the leakage magnetic field onto an electron trajectory from a specimen can be eliminated, and a reduction in detection efficiency of a electrons beam can be prevented.

What is claimed is:

1. A scanning electron microscope comprising:
   a pole piece electrode for accelerating primary electrons emitted at an electrons source;
   an objective lens for focusing the primary electrons onto a specimen, the objective lens including the pole piece electrode, and an electrically and magnetically insulated gap being formed between the pole piece electrode and another pole piece therein;

a detector for detecting electrons generated from the specimen upon irradiation of the primary electrons to the specimen; and an auxiliary coil which is concentric with a coil of the objective lens and is disposed at a middle position between a detection surface of the detector and the gap.

2. The scanning electron microscope according to claim 1, wherein an electric current flows through the objective lens in the opposite direction from that of an electric current flowing through the auxiliary coil.

3. The scanning electron microscope according to claim 1, wherein the auxiliary coil functions to negate a leakage magnetic field which is generated across the gap in the objective lens.

4. The scanning electron microscope according to claim 1, wherein an electric current flowing through the auxiliary coil is controlled to be proportional to an electric current flowing through the objective lens.

5. The scanning electron microscope according to claim 1, wherein an electric currents is supplied to the auxiliary coil and the objective lens coil individually from a common power source.

6. The scanning electron microscope according to claim 1, wherein the auxiliary coil and the objective lens coil are electrically connected in series, and electric currents flow therethrough in the opposite directions from each other.

* * * * *

UNITED STATES PATENT AND TRADEMARK OFFICE
CERTIFICATE OF CORRECTION

| | | |
|---|---|---|
| PATENT NO. | : 7,619,219 B2 | Page 1 of 1 |
| APPLICATION NO. | : 11/953496 | |
| DATED | : November 17, 2009 | |
| INVENTOR(S) | : Naomasa Suzuki et al. | |

It is certified that error appears in the above-identified patent and that said Letters Patent is hereby corrected as shown below:

On the title page, in Column 1, item (30) should read:

(30)    Foreign Application Priority Data

Dec. 11, 2006    (JP)    ............................... 2006-332747

Signed and Sealed this

Ninth Day of February, 2010

David J. Kappos
*Director of the United States Patent and Trademark Office*